United States Patent [19]

Groeber et al.

[11] Patent Number: 4,795,694

[45] Date of Patent: Jan. 3, 1989

[54] MANUFACTURE OF FINE STRUCTURES FOR SEMICONDUCTOR CONTACTING

[75] Inventors: Alfred Groeber, Gauting; Hans Hadersbeck, Munich; Fritz Mueller, Munich; Hubert Zukier, Munich; Hans J. Hacke, Munich, all of Fed. Rep. of Germany

[73] Assignee: Siemens Aktiengesellschaft, Berlin and Munich

[21] Appl. No.: 52,272

[22] Filed: May 21, 1987

[30] Foreign Application Priority Data

Jun. 20, 1986 [DE] Fed. Rep. of Germany ....... 3620628

[51] Int. Cl.$^4$ ............................................. G03L 5/00
[52] U.S. Cl. .................................. 430/314; 430/316; 430/318; 430/329; 430/394; 156/659.1; 156/661.1; 156/664; 204/15
[58] Field of Search ............... 430/311, 312, 313, 314, 430/315, 316, 318, 329, 394, 323, 324; 204/15; 437/228, 229, 230, 245, 246, 928, 938; 156/661.1, 656, 659.1, 664; 174/68.5; 357/70, 52 FP

[56] References Cited

U.S. PATENT DOCUMENTS

| | | |
|---|---|---|
| 4,063,993 | 12/1977 | Burns .................... 430/314 |
| 4,209,355 | 6/1980 | Burns .................... 437/209 |
| 4,259,436 | 3/1981 | Tabuchi et al. ........ 430/312 |
| 4,308,339 | 12/1981 | Lindberg ............... 430/312 |
| 4,472,876 | 9/1984 | Nelson .................. 361/414 |
| 4,512,843 | 4/1985 | Miyazaki ............... 430/312 |
| 4,585,727 | 4/1986 | Reams ................... 430/394 |
| 4,689,114 | 8/1987 | Ohtake et al. ......... 430/313 |
| 4,701,363 | 10/1987 | Barber ................... 430/318 |
| 4,707,418 | 11/1987 | Takias et al. .......... 437/220 |

Primary Examiner—Marion C. McCamish
Assistant Examiner—Donald J. Loney

[57] ABSTRACT

A method for the manufacture of fine structures for semiconductors were in a photographic structuring is carried out on both sides of a smooth, non-stressed metal tape. The tape is etched from both sides. A single sided metal deposition than takes place by means of a float type electroplating. Stabilization of the fine structure is achieved by depositing a lacquer or resin by an electrophoretic deposition or by electro-immersion lacquering. The insulator carrier is applied as one of the final steps of the process.

11 Claims, 1 Drawing Sheet

MANUFACTURE OF FINE STRUCTURES FOR SEMICONDUCTOR CONTACTING

BACKGROUND OF THE INVENTION

1. Field of the Invention

The present invention is in the field of manufacture of fine structures for semiconductor contacting, preferably in the form of a band, and particularly for contacting of multi-pole semiconductors such as an integrated circuit having 320 terminals.

2. Description of the Prior Art

Semiconductor chips are usually contacted to system carriers by means of fine wires, these system carriers then being extrusion coated to form housings.

Another method involves the use of prefabricated structures that are referred to as intermediate substrates or "spiders". In this method, known as tape automated bonding, the semiconductor chip first has all of its terminals simultaneously contacted at the inside region of the fine structure. The user than connects it to the wiring by means of the outer region of the fine structure. This format is extremely small, flat and light. It is being increasingly used in multi-pole semiconductor modules wherein contacting in the traditional way is no longer possible or has disadvantages. However, the demands made of the fine structure with modules having a few hundred terminals in the grid measuring less than 150 microns increase to such a degree that they can not be made with standard manufacturing methods.

There are a number of methods available for the manufacture of fine structures, per se. A standard method for the manufacture of what is referred to as a three layer tape is described, for example in "Solid State Technology 3.78 entitled "Beam Tape Carriers—a Design Guide". This method provides for the punching of openings in the adhesive-coated plastic tape onto which the copper is to be laminated. This tape is coated with a photo-resist, exposed with the negative pattern of the fine structure on the copper side, and then developed. The structure is then galvanically coated for example, with tin in the form of a thin structure. After de-coating, the tape is etched with the electrodeposited surface as an etching protection.

The disadvantage in this method is that there is a pronounced bowl or dish formation when laminating the copper over large openings in the plastic tape, thus preventing the precise generation of photo-technical structure. Coating with a photo-resist on the backside of the tape with the openings is likewise not uniformly possible, thus impeding the resist drying and leading later to uncontrolled errors due to popping of the resist and electroplating punch-throughs.

In other known methods, the openings in the plastic tape are produced by etching or dissolving the plastic and the conductor structures may be generated by additional metal build-up.

SUMMARY OF THE INVENTION

The present invention provides a method of the type described which meets the requirements for fine structures for contacting multi-pole semiconductors.

For example, adequate conductor cross-section of 35 microns thickness can be used despite tight division. Inside contacting and outside contacting occur at different sides of the fine structure and thus at different surfaces in defined regions. Stabilization of the fine structure can be achieved in order to able to carry out bending processees without grid modification. Furthermore, the plastic carrier may serve as an adjustment aid and enable an electrical check.

In keeping with the present invention, there is provided a method for manufacturing fine structures for semiconductor contacting which includes providing a smooth, non-stressed metal tape, photographically structuring both sides of the tape, electrodepositing a metal coating on the upper side of the tape by means of a flotation electroplating process, selectively etching the underside structure of the tape to about one half its thickness, decoating both sides of the tape, applying a plastic stabilizer film to the underside, and finish etching the upper side of the tape.

The smooth tape permits a uniform and problem-free resist coating to be obtained. Heaving and buckling do not occur.

Due to the two-sided photo-technical structuring, reproducibility and precise allocation of both sides are established. As a result of the two-sided etching, the overall under-etching is reduced and a finer structure is obtained than in single-sided etching with the same metal thickness.

The single-sided metal depositions are made possible by the technique of float electroplating in which the band to be coated floats on the electrolyte.

The electrophoretic resist deposition (electrodeposition of paint) or the electro-immersion lacquering permits an accurate manufacture of the grid and later shaping of extremely fine structures. Since the insulator carrier is not applied until the final phase of manufacture, the manufacturing quality is not deteriorated as a result.

The overall method of the present invention may include the following steps:

1. Cleaning the metal tape, for example, a copper tape of 35 microns thickness.
2. Coating both sides of the tape with a photo-resist composition.
3. Providing a two-sided exposure, an electroplating mask at the upper side, and an etching mask at the underside.
4. Developing the two sides.
5. Electrodepositing metal, for example, tin, on the upper side of the tape for later inside contacting by means of float electroplating. Instead of the electroplating mask, i.e., instead of the metal resist, an etching mask such as a photoresist covering can also be applied.
6. Etching of the underside to a value, for example, of 50% of its thickness, usually in an etching channel.
7. Depositing an electrophoretic resist coating or lacquering using an electro-immersion technique into the deeply etched regions between the interconnects with a resin or lacquer which is resistant to removing of photoresist.
8. A second photo-technical structuring following the electrodeposition of the insulating film.
9. Re-exposing the region on the underside to provide for a metallization layer to serve as the outside contacting.
10. Developing the re-exposed region.
11. Electrodepositing metal on the underside, for example, a tin-lead alloy.
12. A two-sided de-coating of the photoresist.
13. Applying a plastic stabilization film onto the underside tape either by laminating a pre-punched carrier laminate or by silk screening a relatively thick lacquer or resin layer.

14. Finishing the etching of the structure from the upper side.

15. Detaching the finished structure.

The method can also be employed without the electrophoretic lacquer deposition or the electro-immersion lacquering for stiffening and without the special metallization steps which are items 7 thru 11 listed above.

The method can also be modified to the extent that an etching mask can be fashioned in the photo-technical structuring instead of the electroplating mask and etching in the etching channel on the underside is carried out to half the depth. The electrophoretic lacquer deposition into the deeply etched regions between the interconnects or the electro-immersion lacquering follows immediately.

After the electrophoretic coating or the electro-immersion lacquering, the upper side is given a finish etch. After finishing the etching, an electrophoretic deposition or an electro-immersion lacquering is also provided on the upper side. As a result, the walls of the interconnects exposed after the etching of the upper side are also covered with the electrophoretically deposited lacquer or resin.

After the de-coating of the photoresist, a metal such as tin is deposited on the upper side on the exposed metal layers. This deposition may also be carried out by means of float electroplating.

After the single-sided metal deposition, a plastic stabilization film is applied in individual pieces. A silk screening lacquer or resin can also be applied instead of the plastic stabilization film in the form of individual pieces punched from a foil.

BRIEF DESCRIPTION OF THE DRAWINGS

The invention shall be set forth in greater detail with respect to an embodiment shown in the figures.

FIGS. 3 to 14 are greatly enlarged views illustrating the methods involved in making the parts, FIGS. 3 to 10 illustrating the basic method, FIG. 11 illustrating a first modification and FIGS. 12 to 14 illustrating a second modification.

DESCRIPTION OF THE PREFERRED EMBODIMENTS

Figure 1:
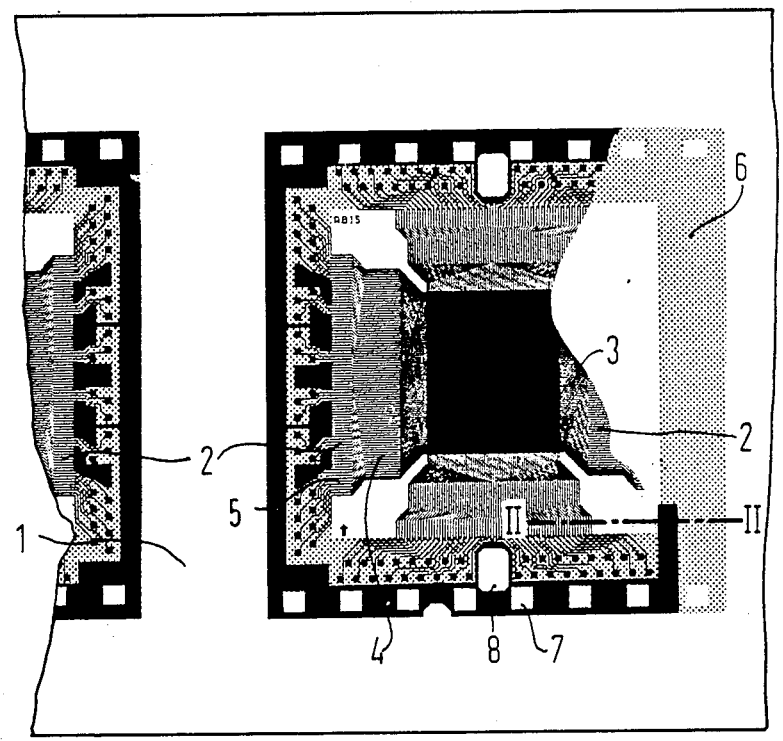
FIG. 1 is a plan view of an individual part.

In FIG. 1, reference 1 refers to a metal tape which serves as the starting material. The preformed structures 2 are composed of interconnects which, viewed in terms of length, comprise an inter-terminal region 3 next to the center intercept, an outside terminal region 4 and a test terminal region 5. Reference 6 indicates a plastic stabilization film composed of a plastic film which is applied to the fine structure as an individual piece before the last etching.

Perforation holes 7 and adjustment holes 8 are provided for further processing and are introduced into the plastic stabilization film 6 and into the copper tape 1.

Figure 2:
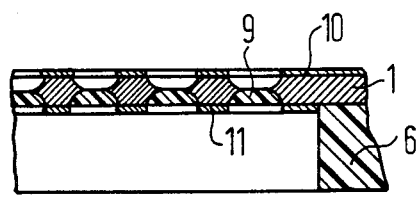
FIG. 2 is a partial sectional view substantially along the line II—II of FIG. 1.

FIG. 2 shows additionally a lacquer or resin 9 being deposited electrophoretically or by electro-immersion lacquering. A tin layer 10 is preferably applied to the upper side of the copper foil 1 and a lead-tin alloy 11 may be applied to the underside in suitable locations.

The sequence of steps in the overall process is illustrated starting with FIG. 3. A clean copper foil 20 is coated on both sides with photoresist layers 21 and 22, respectively. Both layers are photographically exposed and developed to leave patterns 21a and 22a formed on both sides of the copper foil 20, as shown in FIG. 4. Then, a metal such as block tin is deposited, as by flotation electrodeposition, on the pattern 21a to form metal deposits 23, as illustrated in FIG. 5.

Next, the copper foil on its underside is etched back to about one-half its original thickness as shown in FIG. 6. The relatively deep recesses 20a thus formed are filled with an electro-immersion lacquer 24 as shown in FIG. 7.

The next step consists in removing the remaining photoresist patterns 21a and 22a from the foil as shown in FIG. 8.

The next step consists in stabilization with plastic in individual pieces. FIG. 9 illustrates the application of a polyimide film 25 to the lower surface of the foil 20 through the interposition of an adhesive layer 26.

The basic process is completed with a finish etching of the upper side as illustrated in FIG. 10 wherein the copper over the lacquer deposits 24 is removed, using the block tin 23 as a mask, leaving copper platforms under the tin deposits 23.

In a first modification of the process illustrated in FIG. 11, there is a one-sided metal deposition on the bottom side in the regions defined by the removal of the pattern 22a. The metal may be, for example, PbSn, in the form of strips 27 located in a photoresist 28 which extends all the way across the interconnect. The PbSn thus replaces the copper surface of the basic process.

In a second modification illustrated in FIG. 12, the galvanizing mask is replaced by etching masks 29 and 30. There follows a one-sided etching (as shown in FIG. 6) and a deposition of lacquer on one surface (as shown in FIG. 7). This is followed by application of a plstic film as shown in FIG. 9. After a finish etching of the upper side, there occurs a deposition of lacquer on the upper side resulting in lacquer deposits 31 which extend from top to bottom as shown in FIG. 13. Both sides are then etched free from the photoresist masks 29 and 30. Metal deposits 32 are then applied to the copper areas as shown in FIG. 14.

Because of the advantageous combination of method steps, fine structures manufactured in accordance with the present invention satisfy the demands made of a fine structure for contacting multi-pole semiconductors.

It will be understood that various modifications can be made to the described embodiments without departing from the scope of the present invention.

We claim as our invention:

1. A method for manufacturing fine structures for semiconductor contacting which comprises:
   providing a smooth, non-stressed metal tape,
   coating both sides of said tape with a photoresist,
   exposing both sides photographically in a predetermined pattern,
   developing said photoresist after exposure to provide a mask,
   electrodepositing a metal coating on the upper side of said tape by a floatation electroplating process,
   selectively etching the underside structure of said tape to about one half its thickness,
   de-coating the photoresist from both sides of said tape,
   applying a plastic stabilizer film to said underside, and
   finish etching the metal tape from the upper side of said tape.

2. A method according to claim 1 which includes the step of electrodepositing an insulating film resistant to decoating of said photoresist onto said underside after said selective etching.

3. A method according to claim 2 wherein said electrodepositing of said insulating film takes place by electrophoretic deposition.

4. A method according to claim 2 wherein said electroplating of said insulating film takes place by electro-immersion lacquering.

5. A method according to claim 2 which includes:
carrying out both a photographic structuring and a single sided electrodeposition of metal on the lower side of said tape following the electrodeposition of said insulating film.

6. A method according to claim 2 wherein the photographic structuring of the underside is carried out to produce an etching mask and the photographic structuring of said upper side is carried out to produce an electroplating mask.

7. A method according to claim 2 wherein the electrodepositing of said insulating film is followed by a finish etching of the upper side.

8. A method according to claim 7 which includes the step of electrophoretic coating or electro-immersion lacquering of the upper side after said finish etching.

9. A method according to claim 8 which includes the step of depositing a coating of tin on the upper side of said film after said de-coating.

10. A method according to claim 1 wherein said plastic stabilizing film is applied in individual pieces.

11. A method according to claim 1 wherein said plastic stabilizing film is applied in individual pieces by silk screening.

* * * * *